United States Patent [19]
Yegnashankaran et al.

[11] Patent Number: 6,100,590
[45] Date of Patent: *Aug. 8, 2000

[54] LOW CAPACITANCE MULTILEVEL METAL INTERCONNECT STRUCTURE AND METHOD OF MANUFACTURE

[75] Inventors: Visvamohan Yegnashankaran, Redwood City; Hengyang James Lin; Kevin Weaver, both of San Jose, all of Calif.

[73] Assignee: National Semiconductor Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/198,312

[22] Filed: Nov. 23, 1998

[51] Int. Cl.$^7$ ..................................................... H01L 29/00
[52] U.S. Cl. ............................ 257/758; 257/522; 438/622
[58] Field of Search ..................................... 257/522, 758, 257/759, 751; 438/411, 611, 619, 622

[56] References Cited

U.S. PATENT DOCUMENTS 3,890,636  6/1975  Harada et al. .
5,449,953  9/1995  Nathanson et al. ...................... 257/728
5,548,159  8/1996  Jeng ......................................... 257/634

*Primary Examiner*—Sheila V. Clark
*Attorney, Agent, or Firm*—Limbach & Limbach LLP

[57] ABSTRACT

A low capacitance multilevel metal interconnect structure for use in integrated circuits that provides for increased IC device speed and that includes a plurality of patterned metal layers separated and supported by an interconnect dielectric material. The low capacitance multilevel metal interconnect structure has interconnect structure related capacitance lowering gaps in the interconnect dielectric material with the gaps, adjoining at least one of the patterned metal layers. While the gaps adjoin at least the uppermost patterned metal layer, they can also extend downward through the interconnect dielectric material such that they also adjoin one or more patterned metal layers that underlie the uppermost patterned metal layer. A process for the manufacture of the low capacitance multilevel metal interconnect structure includes a step of removing interconnect dielectric material from a conventional multilevel metal interconnect structure to form gaps adjoining at least one of the patterned metal layers. The gaps are formed without removing a substantial amount of interconnect dielectric material from directly underneath any patterned metal layer. This removal can be accomplished with an anisotropic etch and the gaps can be filled with air.

13 Claims, 3 Drawing Sheets

LOW CAPACITANCE MULTILEVEL METAL INTERCONNECT STRUCTURE AND METHOD OF MANUFACTURE

BACKGROUND OF THE INVENTION

1. Field of the Invention

The present invention relates to integrated circuit structures and, in particular, to multilevel metal interconnect structures for use in integrated circuits and methods for their manufacture.

2. Description of the Related Art

Typical integrated circuits (ICs) include multilevel metal interconnect structures that serve a variety of purposes, including carrying electrical signals between individual device elements in the IC, as well as providing power and a connection to ground and to external apparatus. FIG. 1 illustrates a typical multilevel metal interconnect structure 10 that includes patterned metal layers 12, 14, 16 and 18. Multilevel metal interconnect structure 10 is disposed above semiconductor substrate 20 and also includes interconnect dielectric material 22, a plurality of vias (e.g. via 24, via 26, and via 28); and contacts (e.g. contact 30, contact 32, and contact 34).

The patterned metal layers are made up of individual metal lines, such as metal lines 14A and 14B of patterned metal layer 14, carrying signals and providing power, etc.

Interconnect dielectric material 22 provides electrical isolation between the patterned metal layers (for example between patterned metal layers 12 and 14), as well as between metal lines within a given patterned metal layer (for example, between metal lines 14A and 14B of patterned metal layer 14). Although the conventional interconnect dielectric material is silicon dioxide ($SiO_2$), others can also be employed (see U.S. Pat. No. 5,548,159 to Jeng, which is hereby fully incorporated by reference). Interconnect dielectric material 22 is typically formed by depositing a layer of dielectric material after the formation of a patterned metal layer, and stacking one after the other. Therefore, interconnect dielectric material 22 can include contiguous regions where those regions sharing a boundary are fabricated of different dielectric materials (for example, silicon dioxide and silicon nitride). For the sake of clarity, however, the "interconnect dielectric material" will be referred to in the singular throughout this specification, even though it is understood that it may in actuality include more than one dielectric material.

The vias of multilevel metal interconnect structure 10 provide electrical connections between the patterned metal layers separated by the interconnect dielectric material in a manner known in the art. Likewise, the contacts provide an electrical connection between the bottommost patterned metal layer (i.e. patterned metal layer 18) and semiconductor substrate 20.

As is understood by those skilled in the art, semiconductor substrate 20 can include a variety of device elements (not shown in the Figures) on its surface, such as conventional complementary metal oxide semiconductor (CMOS) and bipolar transistors, diodes and other devices.

A drawback of conventional multilevel metal interconnect structures is that their use in sub-micron ICs results in interconnect structure related resistance (R) and capacitance (C) that dominate and increase signal delay. This signal delay is due to the presence of the interconnect dielectric material completely surrounding the patterned metal layers. The presence of interconnect dielectric material in such a configuration creates a metal/dielectric/metal structure that is the source of several capacitance components during IC device operation. As illustrated in FIG. 2, these capacitance components include $C_a$ (i.e. line-to-line capacitance between neighboring metal lines of the same patterned metal layer); $C_b$ (i.e. interlayer capacitance between a metal line of one patterned metal layer and an immediately underlying metal line of another patterned metal layer) and $C_c$ (i.e. interlayer cross-coupling capacitance between a metal line of one patterned metal layer and a diagonally offset underlying metal line of an underlying patterned metal layer). The presence of these capacitances greatly limits device speed by increasing signal delay.

U.S. Pat. No. 5,449,953 to Nathanson et al. describes single level "airbridge" connecting structures for interconnecting monolithic microwave ICs. The manufacturing of these highly specialized structures is, however, not compatible with standard CMOS or bipolar semiconductor device interconnect processing and these structures do not provide a supporting layer beneath the "airbridge."

Still needed in the art is a low capacitance multilevel metal interconnect structure that is simple to manufacture, compatible with standard CMOS and bipolar semiconductor device manufacturing, and provides for increased IC device speed.

SUMMARY OF THE INVENTION

The present invention provides a low capacitance multilevel metal interconnect structure for use in integrated circuits (ICs) that increases integrated circuit speed.

The low capacitance multilevel metal interconnect structure according to the present invention includes a plurality of patterned metal layers that are separated and supported by a gap-containing interconnect dielectric material (for example silicon dioxide or silicon nitride). While the gaps adjoin at least the uppermost patterned metal layer, they can also extend downward through the interconnect dielectric material such that the gaps also adjoin patterned metal layers that lie below the uppermost patterned metal layer. The presence of gaps in the interconnect dielectric material reduces the total interconnect structure related capacitance, by greatly diminishing the $C_a$ (i.e. line-to-line capacitance between neighboring metal lines of the same patterned metal layer) and $C_c$ (i.e. interlayer cross-coupling capacitance between a metal line of one patterned metal layer and a diagonally offset underlying metal line of an underlying patterned metal layer) capacitance components, thereby increasing device speed.

Also provided is a process for manufacturing a low capacitance multilevel metal interconnect structure for use in ICs that is simple and compatible with standard bipolar and CMOS device processing.

The process includes first providing a multilevel metal interconnect structure above a semiconductor substrate, which can be in the form of a wafer or an individual die. The multilevel metal interconnect structure includes a plurality of patterned metal layers connected by vias, and separated and supported by an interconnect dielectric material. Portions of the interconnect dielectric material are subsequently removed to form gaps adjoining at least one of the metal layers. The gaps are formed without removing a substantial amount of interconnect dielectric material from directly underneath the plurality of patterned metal layers. Interconnect dielectric material, therefore, continues to provide support to the patterned metal layers. The resultant structure is a low capacitance multilevel metal interconnect structure in accordance with the present invention.

In one embodiment of a process for manufacturing a low capacitance multilevel metal interconnect structure according to the present invention, the interconnect dielectric material is removed using an anisotropic etch and the gaps are filled with air.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings of which.

DETAILED DESCRIPTION OF THE INVENTION

Figure 1:
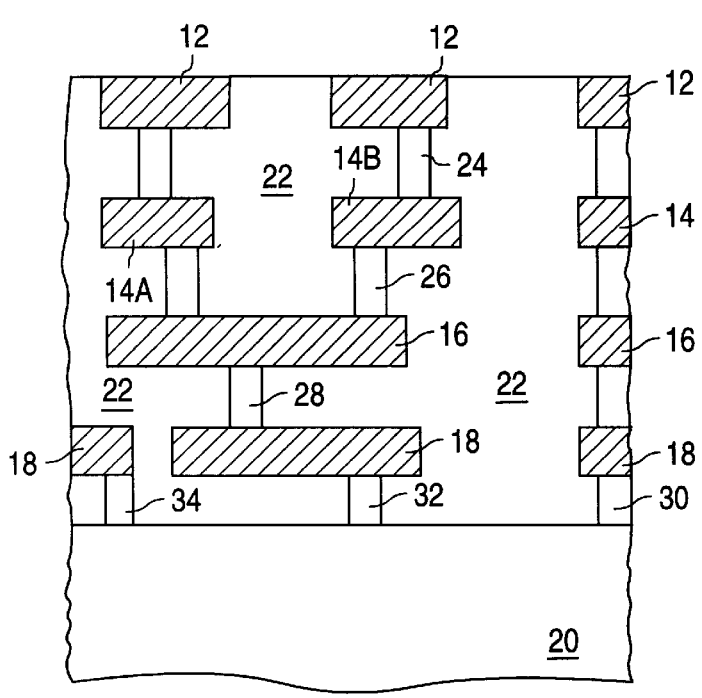
FIG. 1 is a cross-sectional representation of a conventional multilevel metal interconnect structure.
Figure 2:
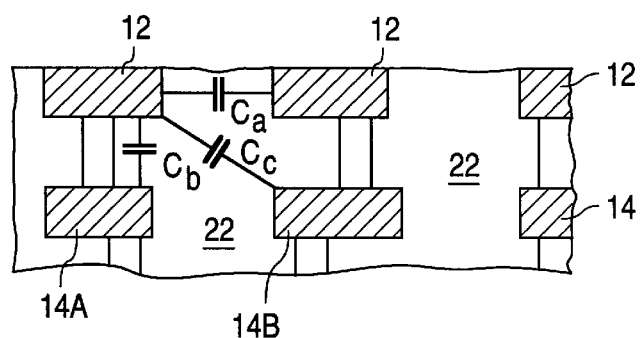
FIG. 2 is a cross-sectional representation of a conventional multilevel metal interconnect structure marked with electrical schematic symbols to depict various contributors to interconnect structure related capacitance.
Figure 3:
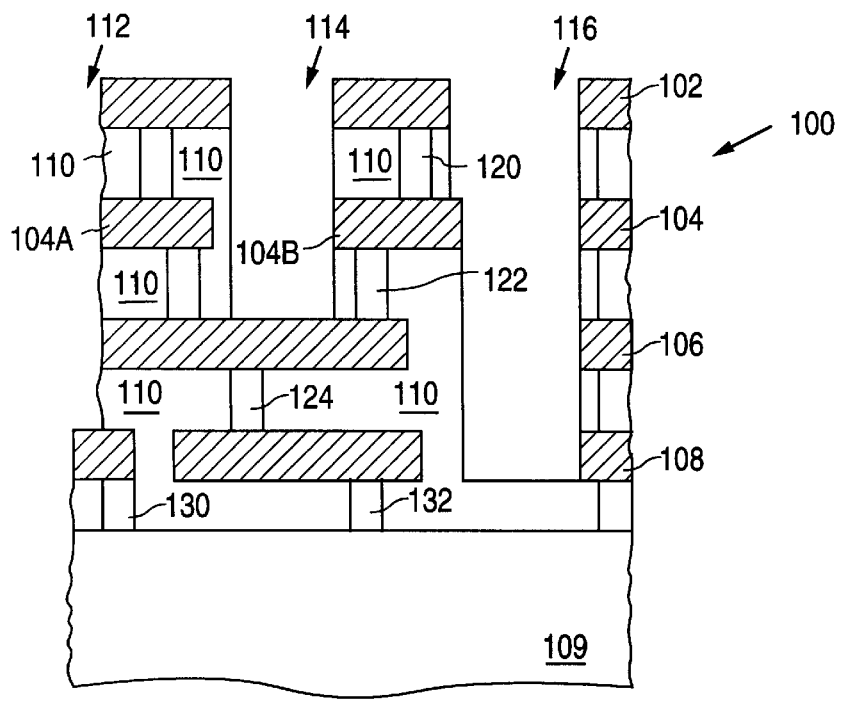
FIG. 3 is a cross-sectional representation of a low capacitance multilevel metal interconnect structure according to the present invention.

As shown in FIG. 3, a multilevel metal interconnect structure 100 for use in ICs according to the present invention includes multiple, in this particular illustration four (4), levels of patterned metal layers (102, 104, 106, and 108) above semiconductor substrate 109.

Although the patterned metal layers included in multilevel metal interconnect structures according to the present invention can be formed of any suitable metal known to those skilled in the art, they are typically formed of aluminum, a multi-layer composite of aluminum overlying a titanium nitride (TiN) or Ti/TiN barrier, or copper. As is evident from the description which follows, the present invention provides a relatively low capacitance multilevel metal interconnect structure regardless of the type of conductive material that is present in the patterned metal layers.

The configuration, or geometry, of the patterned metal layers, such as layer thickness, metal line width, and metal line spacing and pitch, depends on the desired functionality of the IC device with which the multilevel metal interconnect structure will be used, as well as the process technology used to manufacture the multilevel metal interconnect structure. For a typical microprocessor IC with six (6) patterned metal layers, the uppermost (sixth) patterned metal layer can, for example, be as thick as 2 microns, while the remaining patterned metal layers underneath (e.g. the first and second layers used for signal distribution) can, for example, be 5000 to 6000 angstroms in thickness. The width of the metal lines for an 0.18 micron process technology can be, for example, 0.28 microns.

Interconnect dielectric material 110 (typically silicon dioxide, although other dielectric materials known in art, or combinations thereof, can be employed) separates and isolates the patterned metal layers. Interconnect dielectric material 110 includes gaps 112, 114, and 116 adjoining the patterned metal layers. Gaps 112, 114, and 116 extend downward, starting from where they adjoin the uppermost patterned metal layer (layer 102), through the interconnect dielectric material 110 until they adjoin a lower patterned metal layer (e.g. layer 104).

Gaps 112, 114, and 116 are "adjoining" the patterned metal layers in the sense that the gaps can be described as "next to," "neighboring," "by the side of" or "situated close by" the patterned metal layers. As illustrated in FIG. 3, the gaps are not necessarily contiguous with the metal lines which make up the patterned metal layers. Gap 114 is, for example, contiguous with patterned metal layer 102 but merely neighboring, or situated close by, metal line 104A of patterned metal layer 104. While adjoining the patterned metal layers, the gaps do not extend significantly underneath the patterned metal layers, leaving a sufficient amount of interconnect dielectric material 110 to support the patterned metal layers.

The thickness of the interconnect dielectric material separating one patterned metal layer from the next is dependent upon the process technology used to manufacture the multilevel interconnect structure, but typical values are in the range of 6,000 to 10,000 angstroms.

The gaps in the interconnect dielectric material can be filled with air. The dielectric constant of air is approximately 1.00059, while the dielectric constant of conventionally formed $SiO_2$ used in typical multilevel metal interconnect structures is approximately 3.9. The presence of air with a relatively low dielectric constant in the gaps, compared to $SiO_2$, reduces the $C_a$ and $C_c$ capacitance components of the total interconnect structure related capacitance.

Since total interconnect structure related capacitance is the dominant factor affecting the RC time delay in submicron ICs, the presence of gaps in the interconnect dielectric material greatly reduces the total interconnect structure related capacitance, thereby increasing IC device speed. The contribution of the $C_a$ and $C_c$ capacitance components to the total interconnect structure related capacitance depends on the particular geometry of the integrated circuit layout (e.g. metal line-to-line spacing, thickness of the interconnect dielectric material between metal layers, etc.). For conventional microprocessors, however, $C_a$ and $C_c$ can account for 60–70% or more of the total interconnect structure related capacitance. In essence, the multilevel metal interconnect structure according to the present invention provides for a reduction in the interconnect structure related capacitance of any CMOS or bipolar IC that includes a multilevel metal interconnect structure by eliminating a portion of the interconnect dielectric material therein, thereby decreasing $C_a$ and $C_c$ capacitance components.

Figure 4:
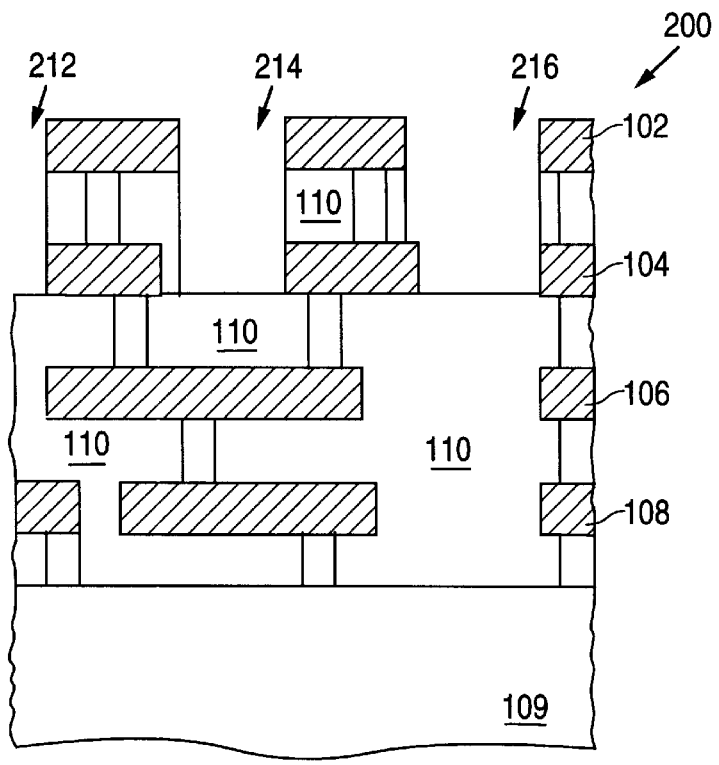
FIG. 4 is a cross-sectional representation of another low capacitance multilevel metal interconnect structure according to the present invention.
Figure 5:
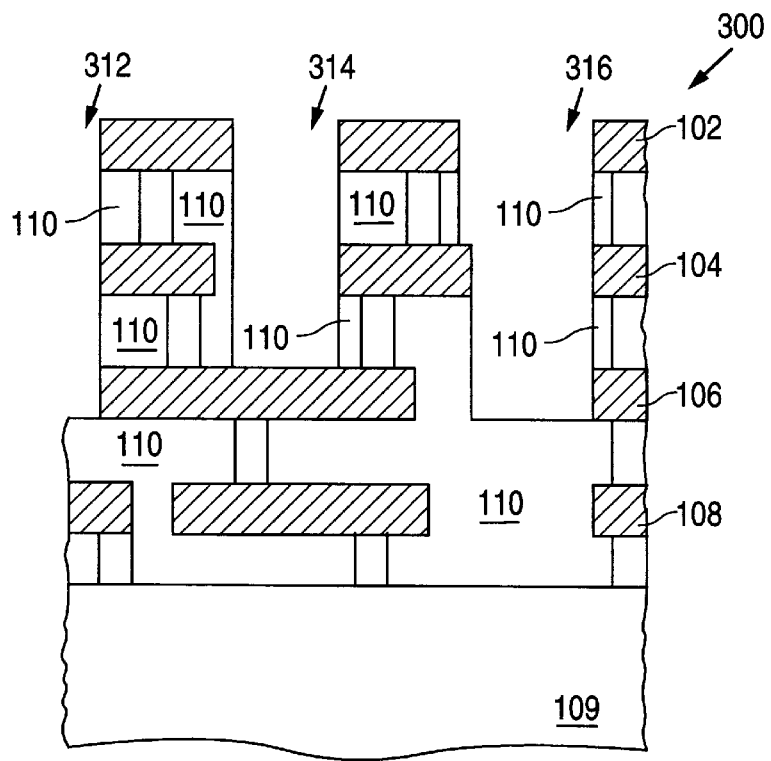
FIG. 5 is a cross-sectional representation of yet another low capacitance multilevel metal interconnect structure according to the present invention.

Multilevel metal interconnect structure 100 also includes vias electrically connecting the patterned metal layers (such as vias 120, 122 and 124), as well as contacts (such as contacts 130 and 132). The multilevel metal interconnect structure in accordance with the present invention can include gaps adjoining all of the patterned metal layers (such as gaps 112, 114, and 116, as illustrated in FIG. 3) or gaps adjoining only a few uppermost patterned metal layers (such as gaps 212, 214 and 216 of multilevel metal interconnect structure 200, as illustrated in FIG. 4, and gaps 312, 314 and 316 of multilevel metal interconnect structure 300, as illustrated in FIG. 5).

The lower patterned metal layers of microprocessor ICs are typically used for signal distribution, while the upper patterned metals layers are ordinarily used for providing power and ground. The presence of gaps in the interconnect dielectric material adjoining the lower patterned metal layers will, therefore, significantly improve device speed compared to conventional multilevel metal interconnect structures, although sufficient reductions in total interconnect structure related capacitance to notably increase device speed can still be achieved even when the gaps are adjoining only the uppermost patterned metal layer or the upper patterned metal layers.

Figure 6:
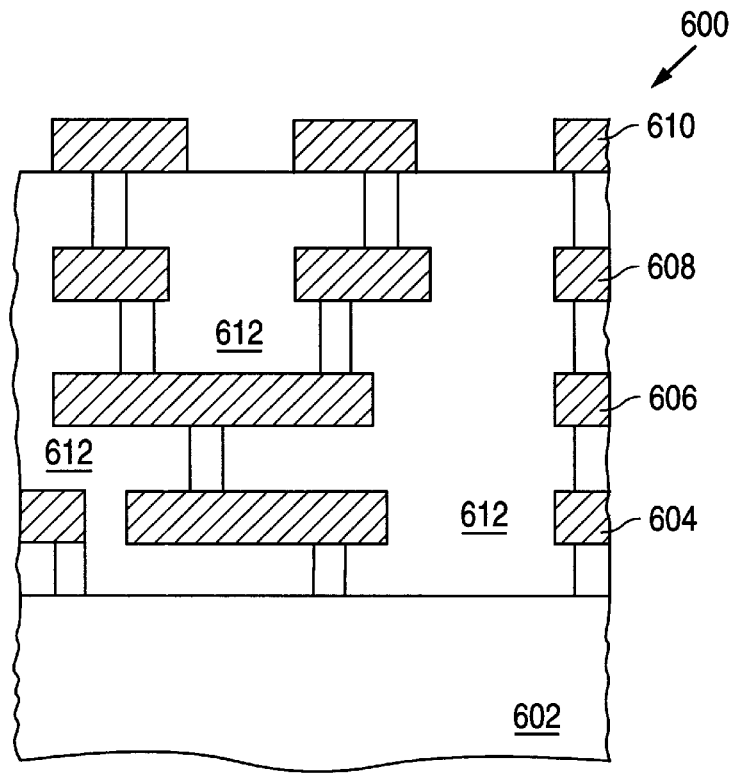
FIGS. 6–7 are cross-sectional representations illustrating steps in a process for manufacturing a low capacitance multilevel metal interconnect structure according to the present invention.
Figure 7:
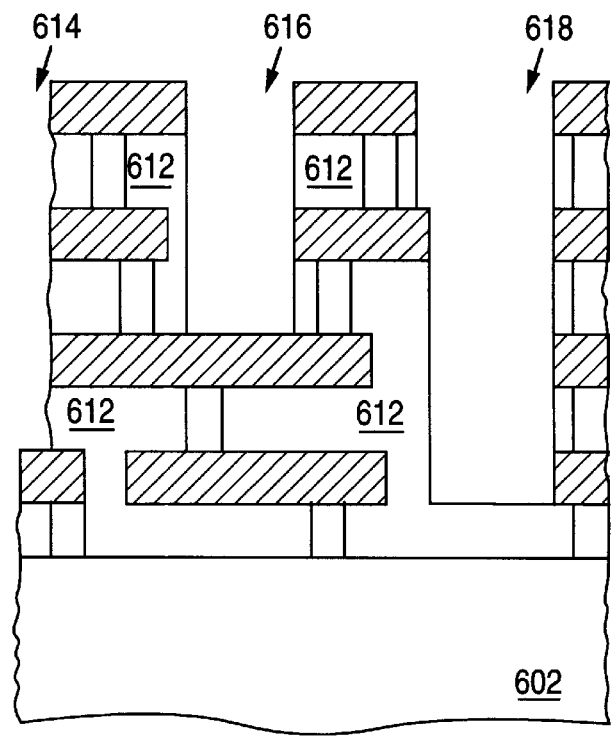

Also provided is a process for manufacturing a low capacitance multilevel metal interconnect structure that is simple and compatible with conventional CMOS and bipolar processing. FIGS. 6–7 illustrate stages of such a process.

A multilevel metal interconnect structure 600 is first provided, as illustrated in FIG. 6. Multilevel metal interconnect structure 600 is disposed above semiconductor substrate 602. Multilevel metal interconnect structure 600 can be formed by processes that are well known to those skilled in the art. Semiconductor substrate 602 can be provided either in wafer form (for example, a silicon wafer provided immediately after etching of the uppermost patterned metal layer disposed above the wafer), as part of an individual IC die, or as part of an individual IC die during a packaging process. Multilevel metal interconnect structure 600 includes a plurality of patterned metal layers, such as lower patterned metal layers 604, 606 and 608 which are separated and completely surrounded by interconnect dielectric material 612, and an uppermost patterned metal layer. A portion of interconnect dielectric material 612 is then removed to form a plurality of gaps 614, 616 and 618, adjoining at least one patterned metal layer. The resulting low capacitance multilevel metal interconnect structure is illustrated in FIG. 7.

In one embodiment of a process for manufacturing a low capacitance multilevel metal interconnect structure according to the present invention, the portion of the interconnect dielectric material is removed using an anisotropic dry etch while leaving a sufficient amount of the interconnect dielectric material underneath the patterned metal layers to provide support.

HDP RIE etching systems are suitable for providing the such an anisotropic etch, although other types of etching systems can also be used, including basic RIE systems. Basic RIE systems may, however, require plasma focus fixtures, optimized etch recipes, high pumping velocity and optimized chamber cooling, before they can be successfully employed in a process according to the present invention. Benefits of an HDP system include a short process time (about 1/15 that of conventional RIE etchers) and lack of redeposition during the etch process.

Removal of a portion of the interconnect dielectric material beyond the bottommost patterned metal layer introduces a risk of inadvertently etching into device element structures, such as polysilicon transistor gates. The removal is, therefore, typically stopped once a gap reaches a level near the bottommost patterned metal layer. Other deciding factors of when to stop the gap-making etch process include the layout density of the circuit and routing metallization, as well as the type of the circuit in a localized area.

The use of an anisotropic etch, or other interconnect dielectric material removal process, with a high selectivity to metal (i.e. removing interconnect dielectric material at a significantly higher rate than removing metal) is preferred in order to avoid the metal layers being adversely affected. It is also preferred that the interconnect dielectric material be removed using a perfectly anisotropic interconnect dielectric material etching process (i.e. a process with almost no lateral etching component), so that a sufficient amount of interconnect dielectric material remains directly underneath the patterned metal layers to provide support. In one embodiment, the resultant gaps can be filled with air.

In the example below, a low capacitance multilevel metal interconnect structure and a process of its manufacture in accordance with the present invention are tested for improvement in device speed.

EXAMPLE

A Cyrix GXM microprocessor IC with five (5) levels of patterned metal layers was provided. All five patterned metal layers were fabricated of aluminum with a Ti-TiN barrier and ranged in thickness from 9000 angstroms (for the uppermost patterned metal layer) to 4,500–7,000 angstroms (for the bottommost patterned metal layer). Line width of the patterned metal layers was 0.35–0.40 micron with a pitch of about 0.8 microns. The interconnect dielectric material was conventional silicon dioxide, with a thickness between the patterned metal layers of from about 7,000 angstroms to about 9,000 angstroms.

The device speed of the conventional microprocessor, which is inversely proportional to interconnect structure related capacitance, was 233 MHz when measured at 85° C. and a low $V_{dd}$ (i.e. the highest circuit potential).

Gaps were then formed in the interconnect dielectric material using a Nextral Model 860 HDP RIE etching system. The Nextral system employed had two power sources: a 2.45 GHz microwave generator which produces a plasma and a 13.56 MHz RF generator which controls cathode biasing. The following anisotropic etch conditions were employed:

50 sccm of an Ar, $CHF_3$ and $O_2$ gas mixture;

15 mTorr pressure;

UHF power 1850 watts;

self bias 27 volts; and temperature of less than 80° C.

The device speed, measured under the same conditions as with the aforementioned conventional microprocessor, after formation of gaps down to the fourth patterned metal layer (i.e. the immediately below the uppermost [fifth] patterned metal layer) by anisotropic etching was 247 MHz. This corresponded to 6% increase in device speed compared to the conventional microprocessor without any gaps Further removal of interconnect dielectric material to form gaps down to the second patterned metal layer (i.e. the layer immediately above the bottommost [first] patterned metal layer) by anisotropic etching yielded a device speed of 263 MHz, corresponding to a 13% improvement over the conventional microprocessor.

In this example, the gaps that were formed in the interconnect dielectric material were filled with air. Based on the observed increase in device speed, there was an estimated 10–15% reduction in interconnect structure related capacitance.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A low capacitance multilevel metal interconnect structure for use in integrated circuits, the multilevel metal interconnect structure comprising:

a plurality of patterned metal layers including an uppermost patterned metal layer and at least one underlying patterned metal layer; and interconnect dielectric material separating and supporting the patterned metal layers, the interconnect material having at least one gap adjoining at least the uppermost patterned metal layer and an underlying patterned metal layer, wherein the at least one gap extends vertically downward but does not extend underneath of any of the plurality of patterned metal layers.

2. The low capacitance multilevel metal interconnect structure of claim 1 wherein the interconnect dielectric material has a plurality of gaps.

3. The low capacitance multilevel metal interconnect structure of claim 2, wherein the gaps contain air.

4. The low capacitance multilevel metal interconnect structure of claim 2 wherein the interconnect dielectric material is silicon dioxide.

5. The low capacitance multilevel metal interconnect structure of claim 2 wherein the gaps extend downward such that at least one of the gaps also adjoins more than two of the plurality of patterned metal layers.

6. A method for manufacturing a low capacitance multilevel metal interconnect structure for use in integrated circuits, the method comprising the steps of:

providing a multilevel metal interconnect structure above a semiconductor substrate, the multilevel metal interconnect structure having a plurality of patterned metal layers, including an uppermost patterned metal layer and at least one underlying patterned metal layer, connected by vias and separated by an interconnect dielectric material; and removing portions of the interconnect dielectric material to form at least one gap in the interconnect dielectric material adjoining at least the uppermost patterned metal layer and an underlying patterned metal layer and extending vertically downward, without removing interconnect dielectric material from directly underneath of any of the plurality of patterned metal layers.

7. The method of claim 6 wherein the step of removing interconnect dielectric material includes the step of anisotropically etching the interconnect dielectric material.

8. The method of claim 6, wherein the step of removing interconnect dielectric material includes removing the interconnect dielectric material to form a plurality of gaps adjoining more than two of the plurality of patterned metal layers.

9. The method of claim 6, wherein the step of providing a multilevel metal interconnect structure includes providing a multilevel metal interconnect structure above a semiconductor substrate in wafer form.

10. The method of claim 6, wherein the step of providing a multilevel metal interconnect structure includes providing a multilevel metal interconnect structure above a semiconductor substrate in die form.

11. A low capacitance multilevel metal interconnect structure for use in integrated circuits, the multilevel metal interconnect structure comprising:

a plurality of patterned metal layers including an uppermost patterned metal layer and at least one underlying patterned metal layer; and silicon dioxide separating and supporting the patterned metal layers, the silicon dioxide having at least one gap adjoining at least the uppermost patterned metal layer and an underlying patterned metal layer, wherein the at least one gap extends vertically downward and does not extend underneath of any of the patterned metal layers.

12. The low capacitance multilevel metal interconnect structure of claim 11, wherein the silicon dioxide has a plurality of gaps.

13. The low capacitance multilevel metal interconnect structure of claim 11 wherein the gaps do not extend significantly underneath the patterned metal layers.

* * * * *

UNITED STATES PATENT AND TRADEMARK OFFICE
CERTIFICATE OF CORRECTION

PATENT NO.   : 6,100,590
DATED        : August 8, 2000
INVENTOR(S)  : Visvamohan Yegnashankaran et al.

Page 1 of 1

It is certified that error appears in the above-identified patent and that said Letters Patent is hereby corrected as shown below:

<u>Column 7,</u>
Line 5, please insert the word -- dielectric -- after the word "interconnect" and before the word "material".

Signed and Sealed this

Seventh Day of August, 2001

Attest:

NICHOLAS P. GODICI
*Attesting Officer*       *Acting Director of the United States Patent and Trademark Office*